(12) United States Patent
Ahn et al.

(10) Patent No.: US 7,417,458 B2
(45) Date of Patent: Aug. 26, 2008

(54) GATE DRIVING CIRCUIT AND DISPLAY APPARATUS HAVING THE SAME

(75) Inventors: Byeong-Jae Ahn, Suwon-si (KR); Sung-Man Kim, Seoul (KR); Bong-Jun Lee, Seoul (KR); Hong-Woo Lee, Cheonan-si (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 11/840,471

(22) Filed: Aug. 17, 2007

(65) Prior Publication Data

US 2008/0048712 A1 Feb. 28, 2008

(30) Foreign Application Priority Data

Aug. 24, 2006 (KR) .................. 10-2006-0080702

(51) Int. Cl.
*G06F 7/38* (2006.01)
*H03K 19/173* (2006.01)

(52) U.S. Cl. .................. 326/46; 326/93; 326/27; 341/100

(58) Field of Classification Search .............. None
See application file for complete search history.

(56) References Cited

U.S. PATENT DOCUMENTS

2006/0061562 A1* 3/2006 Park et al. ............... 345/204
2006/0146978 A1* 7/2006 Jang ........................ 377/64
2008/0012816 A1* 1/2008 Moon ...................... 345/100

* cited by examiner

*Primary Examiner*—Anh Q Tran
(74) *Attorney, Agent, or Firm*—H.C. Park & Associates, PLC

(57) ABSTRACT

In a gate driving circuit and a display apparatus having the same, a ripple preventing part is connected to a pull-up part and a control terminal (Q-node) to reset the Q-node. The ripple preventing part includes a first ripple preventing device that resets the Q-node during a high period of the first clock within a (n−1)H period, and a second ripple preventing device that resets the Q-node during a high period of a second clock within the (n−1)H period. A back-flow preventing device is connected between a previous carry node and the second ripple preventing device to prevent an electric charge of the Q-node from flowing back to the previous carry node.

23 Claims, 13 Drawing Sheets

GATE DRIVING CIRCUIT AND DISPLAY APPARATUS HAVING THE SAME

CROSS-REFERENCE TO RELATED APPLICATION

This application claims priority from and the benefit of Korean Patent Application No. 2006-80702, filed on Aug. 24, 2006, which is hereby incorporated by reference for all purposes as if fully set forth herein.

BACKGROUND OF THE INVENTION

1. Field of the Invention

The present invention relates to a gate driving circuit and a display apparatus including the gate driving circuit. More particularly, the present invention relates to a gate driving circuit, which may have improved reliability at high temperatures, and a display apparatus including the gate driving circuit.

2. Discussion of the Background

In general, a liquid crystal display device includes a liquid crystal display panel having a lower substrate, an upper substrate facing the lower substrate, and a liquid crystal layer interposed between the lower substrate and the upper substrate, which displays an image.

The liquid crystal display panel includes a plurality of gate lines, a plurality of data lines, and a plurality of pixels connected to the gate lines and the data lines, which are formed on the liquid crystal display panel. A gate driving circuit may be directly formed on the liquid crystal display panel through a thin film process and sequentially outputs a gate signal to the gate lines.

Generally, a gate driving circuit includes a shift register in which a plurality of stages are connected in series to each other. That is, each stage includes a plurality of driving transistors, which apply a gate voltage to corresponding gate lines. Specifically, each stage includes a pull-up transistor connected to a gate line to output a gate voltage and a carry transistor connected to an input terminal of a next stage to output a carry voltage that is used to control the drive of the next stage. Therefore, the gate driving circuit may prevent distorted signals caused by a load connected to the gate line from being applied to the next stage, thereby preventing malfunction thereof.

Control terminals of the pull-up transistor and the carry transistor are commonly connected to a Q-node in each stage. Thus, the Q-node has an electric potential of a turn-off voltage that is lower than a threshold voltage during a (n−1)H period where a gate voltage and a carry voltage are maintained at a low state, while the Q-node has an electric potential of a turn-on voltage that is higher than the threshold voltage during a 1H period where the gate voltage and the carry voltage are maintained at a high state.

However, a Q-node is generally connected to a previous carry node during a predetermined period within a (n−1)H period and an electric potential of the Q-node is floated. Thus, the pull-up transistor and the carry transistor are not held in a turn-off state, which results in rippling of the gate voltage and the carry voltage. Particularly, when current characteristics of the pull-up transistor and the carry transistor are varied while a liquid crystal display panel is tested at high temperatures, the reliability of the gate driving circuit may deteriorate due to noise being applied through the Q-node in a floating state.

When the Q-node is connected to the previous carry node and the electric potential of the Q-node is reversely applied to the previous carry node, a ripple may occur in the previous carry node. Since the previous carry node is connected to an input terminal of a present stage, the ripple generated in the previous carry node applies an abnormal input signal to the present stage, thereby causing a malfunction of the present stage.

SUMMARY OF THE INVENTION

The present invention provides a gate driving circuit that may have greater reliability and be less likely to malfunction at high temperatures.

The present invention also provides a display apparatus including the above gate driving circuit.

Additional features of the invention will be set forth in the description which follows, and in part will be apparent from the description, or may be learned by practice of the invention.

The present invention discloses a gate driving circuit including a plurality of stages connected to each other. Each stage includes a pull-up part, a carry part, a pull-down part, a pull-up driving part, and a ripple preventing part.

The pull-up part pulls up a present gate signal to a first clock during a 1H period, and the carry part pulls up a present carry signal to the first clock during the 1H period. The pull-down part receives a next gate signal from a next stage to discharge the present gate signal to an off-voltage. The pull-up driving part receives a previous carry signal from a previous stage to turn on the pull-up part and the carry part and turns off the pull-up part and the carry part in response to the next gate signal. The pull-up driving part is connected to a control terminal (hereinafter, referred to as a Q-node) of the carry part and the pull-up part.

In one exemplary embodiment, the ripple preventing part includes a first ripple preventing device, a second ripple preventing device, and a back-flow preventing device to prevent a ripple of the present gate signal and the present carry signal. The first ripple preventing device connects the Q-node and a present output terminal during a high period of the first clock within an (n−1)H period, and the second ripple preventing device connects an output terminal (hereinafter, referred to as a previous carry node) of a previous carry part and the Q-node during a high period of a second clock within the (n−1)H period. The back-flow preventing device is connected between the previous carry node and the second ripple preventing device to prevent an electric charge of the Q-node from flowing back to the previous carry node.

In another exemplary embodiment, the ripple preventing part includes a first ripple preventing device to connect the Q-node and a present output terminal during a high period of the first clock within a (n−1)H period and a holding capacitor connected between a previous carry node an off-voltage terminal to reduce the ripple of the previous carry node.

The invention also discloses a display apparatus including a display part to display an image in response to a gate signal and a data signal, a data driving circuit applying the data signal to the display part, and a gate driving circuit in which a plurality of stages are connected to each other to output the gate signal to the display part.

Each of the stages includes a pull-up part, a carry part, a pull-down part, a pull-up driving part, and a ripple preventing part.

The pull-up part pulls up a present gate signal to a first clock during a 1H period, and the carry part pulls up a present carry signal to the first clock during the 1H period. The pull-down part receives a next gate signal from a next stage to discharge the present gate signal to an off-voltage. The pull-up driving part receives a previous carry signal from a previous stage to turn on the pull-up part and the carry part and turns off the pull-up part and the carry part in response to the next gate signal. The pull-up driving part is connected to a Q-node of the carry part and the pull-up part.

In one exemplary embodiment, the ripple preventing part includes a first ripple preventing device, a second ripple preventing device, and a back-flow preventing device to prevent a ripple of the present gate signal and the present carry signal. The first ripple preventing device connects the Q-node and a present output terminal during a high period of the first clock within a (n−1)H period, and the second ripple preventing device connects a previous carry node and the Q-node during a high period of a second clock within the (n−1)H period. The back-flow preventing device is connected between the previous carry node and the second ripple preventing device to prevent an electric charge of the Q-node from being flowing back to the previous carry node.

In another exemplary embodiment, the ripple preventing part includes a first ripple preventing device to connect the Q-node and a present output terminal during a high period of the first clock within a (n−1)H period and a holding capacitor connected between a previous carry node an off-voltage terminal to reduce the ripple of the previous carry node.

According to the above, the electric potential of the Q-node and the carry node may be stabilized, thereby preventing a malfunction of the gate driving circuit and improving the reliability of the liquid crystal display at high temperatures.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
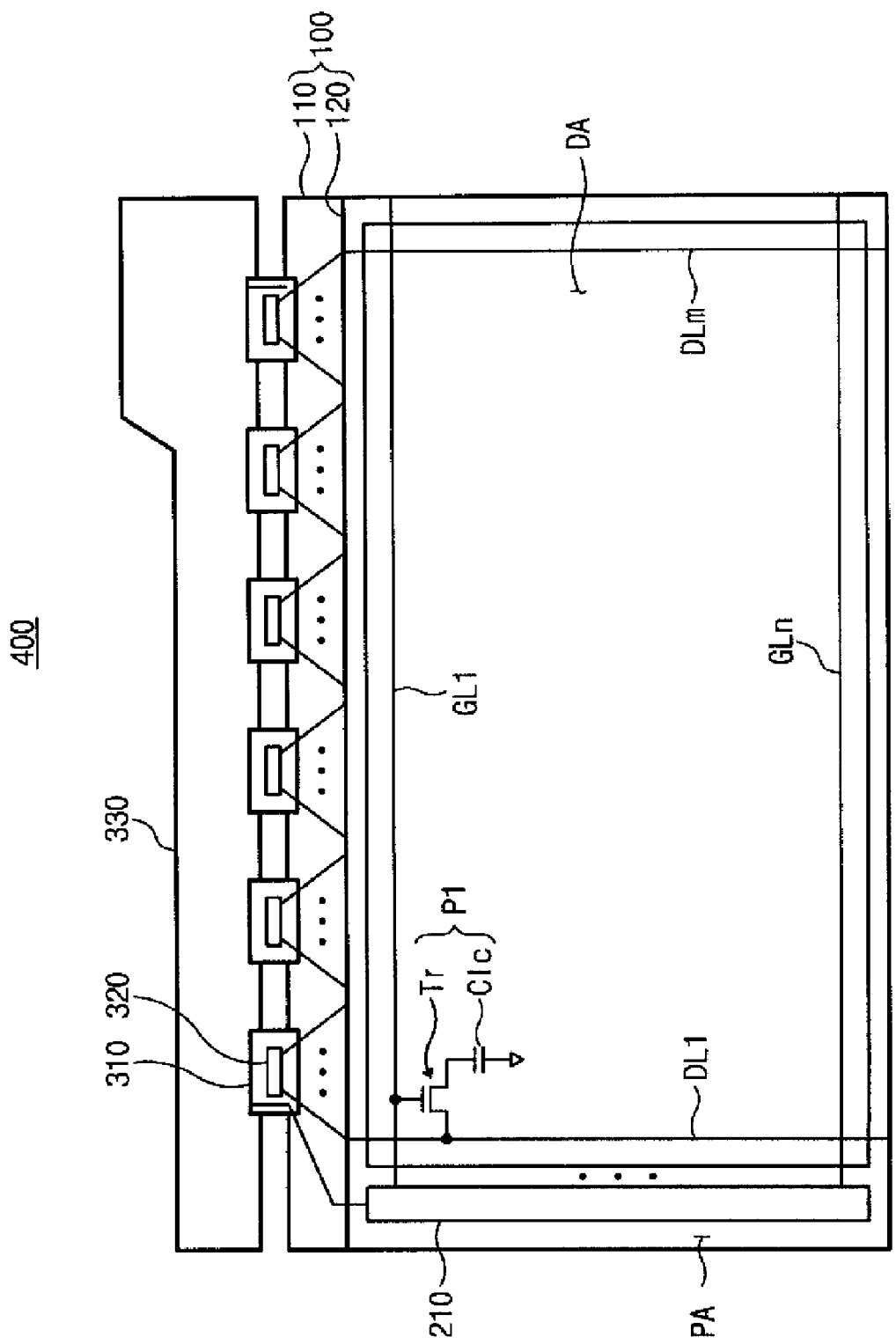
FIG. 1 is a plan view showing an exemplary embodiment of a liquid crystal display apparatus according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

FIG. 1 is a plan view showing an exemplary embodiment of a liquid crystal display apparatus according to the present invention.

Referring to FIG. 1, a liquid crystal display apparatus 400 includes a liquid crystal display panel 100 displaying an image, a plurality of data driving chips 320 outputting a data voltage to the liquid crystal display panel 100, and a gate driving circuit 210 outputting a gate voltage to the liquid display panel 100.

The liquid crystal display panel 100 includes a lower substrate 110, an upper substrate 120 facing the lower substrate 110, and a liquid crystal layer (not shown) interposed between the lower substrate 110 and the upper substrate 120. The liquid crystal display panel 100 includes a display area DA on which an image is displayed and a peripheral area PA adjacent to the display area DA.

In the display area DA, a plurality of pixel areas are defined in a matrix configuration by a plurality of gate lines GL1-GLn and a plurality of data lines DL1-DLm insulated from and crossing the gate lines GL1-GLn. Each pixel area includes a pixel P1 having a thin film transistor Tr and a liquid crystal capacitor Clc. The thin film transistor Tr includes a gate electrode connected to a first gate line GL1, a source electrode connected to a first data line DL1, and a drain electrode connected to a pixel electrode that serves as a first electrode of the liquid crystal capacitor Clc.

The gate driving circuit 210 is formed in the peripheral area PA adjacent to one end of the gate lines GL1-GLn. The gate driving circuit 210 is connected to one end of the gate lines GL1-GLn and sequentially applies the gate voltage to the gate lines GL1-GLn.

A plurality of tape carrier packages (TCPs) 310 are attached to the peripheral area PA adjacent to one end of the data lines DL1-DLm. The data driving chips 320 are mounted on the TCPs 310, respectively. The data driving chips 320 are connected to one end of the data lines DL1-DLm and output the data voltage to the data lines DL1-DLm.

The liquid crystal display apparatus 400 further includes a printed circuit board 330 to control the driving of the gate driving circuit 210 and the data driving chips 320. The printed circuit board 330 outputs a data control signal and image data for the data driving chips 320 and a gate control signal for the gate driving circuit 210. The data control signal and the image data are applied to the data driving chips 320 through the TCPs 310. The gate control signal is applied to the gate driving circuit 210 through the TCP that is closest to the gate driving circuit 210.

Figure 2:
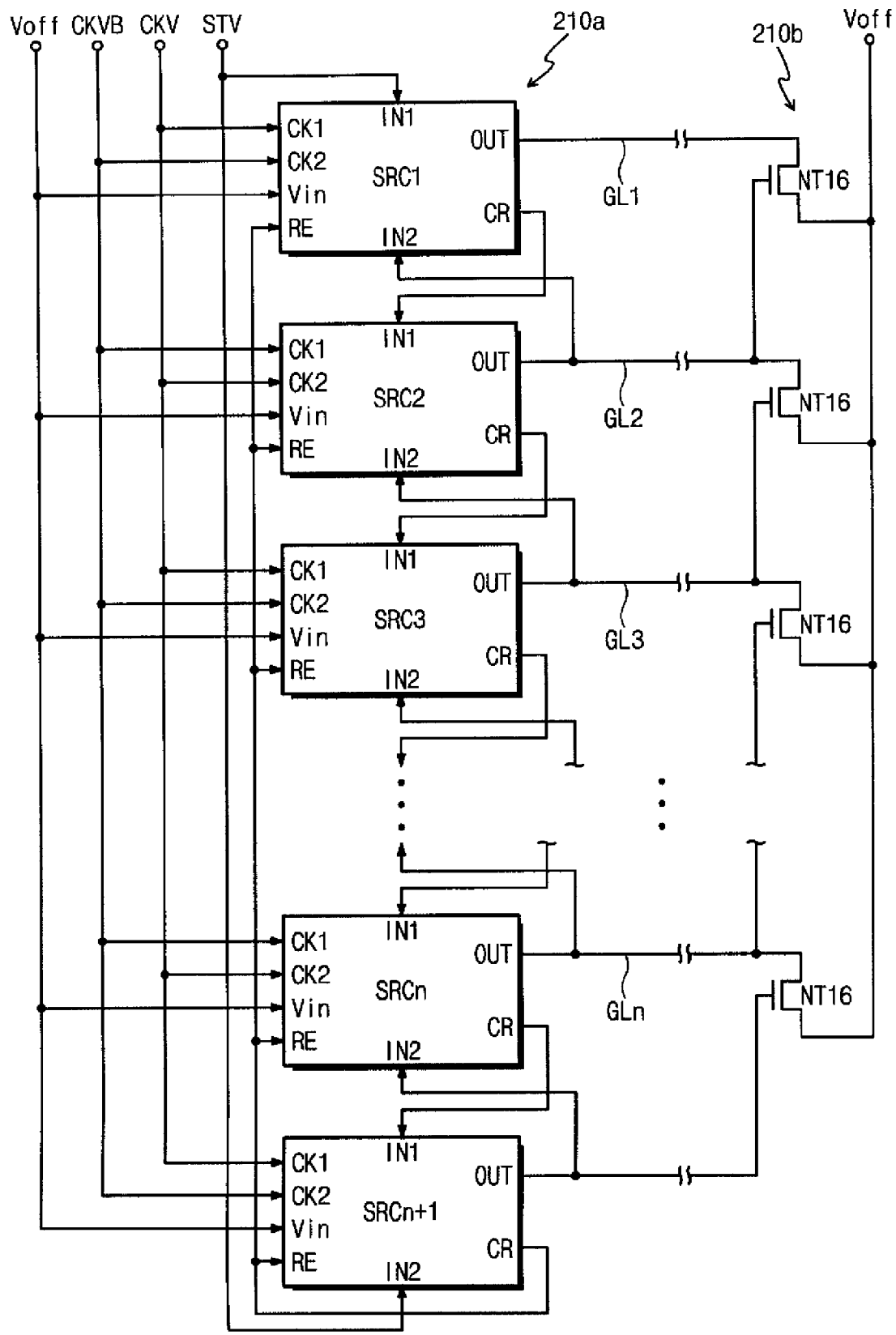
FIG. 2 is a block diagram showing a gate driving circuit of FIG. 1.

FIG. 2 is a block diagram showing a gate driving circuit of FIG. 1.

Referring to FIG. 2, the gate driving circuit 210 includes a shift register 210a having a plurality of stages SRC1-SRCn+1 connected in series to each other. Each stage includes a first input terminal IN1, a first clock terminal CK1, a second clock terminal CK2, a second input terminal IN2, a voltage input terminal Vin, a reset terminal RE, an output terminal OUT, and a carry terminal CR.

The first input terminal IN1 of each stage SRC2-SRCn+1 is connected to the carry terminal CR of a previous stage to receive a previous carry voltage. In the present embodiment, the first input terminal IN1 of the first stage SRC1 receives a start signal STV that starts the driving of the gate driving circuit 210. The second input terminal IN2 of each stage SRC1-SRCn is connected to the output terminal OUT of the next stage to receive the next gate voltage. The second input terminal IN2 of the last stage SRCn+1 receives the start signal STV.

A first clock CKV is provided to the first clock terminal CK1 and a second clock CKVB, having a phase opposite that of the first clock CKV, is provided to the second clock terminal CK2 of odd-numbered stages, SRC1, SRC3, . . . , SRCn+1, among the stages SRC1-SRCn+1. The second clock CKVB is provided to the first clock terminal CK1 and the first clock CKV is provided to the second clock terminal CK2 of even-numbered stages SRC2, . . . , SRCn among the stages SRC1-SRCn+1.

A ground voltage or an off-voltage Voff is provided to the voltage input terminal Vin of the stages SRC1-SRCn+1. Also, the carry terminal CR of the last stage SRCn+1 is connected to the reset terminal RE of the stages SRC1-SRCn+1.

The output terminals OUT of the stages SRC1-SRCn are connected to the gate lines GL1, GL2, GL3, . . . , GLn, respectively. Therefore, the stages SRC1-SRCn may sequentially output the gate voltage through the output terminals OUT to apply the gate voltage to the gate lines GL1-GLn.

The shift register 210a is arranged adjacent to the first end of the gate lines GL1-GLn. The gate driving circuit 210 further includes a discharge circuit 210b, which is arranged adjacent to the second end of the gate lines GL1-GLn, to discharge a present gate line to the off-voltage Voff in response to the next gate voltage outputted from the next stage. The discharge circuit 210b includes a number of discharge transistors NT16 equal to the number of the gate lines GL1-GLn, and each discharge transistor NT16 has a control electrode connected to a next gate line, an input electrode to which the off-voltage Voff is applied, and an output electrode connected to the present gate line. The output terminal OUT of the last stage SRCn+1 is connected to the control electrode of the discharge transistor NT16 through a dummy line.

Figure 3:
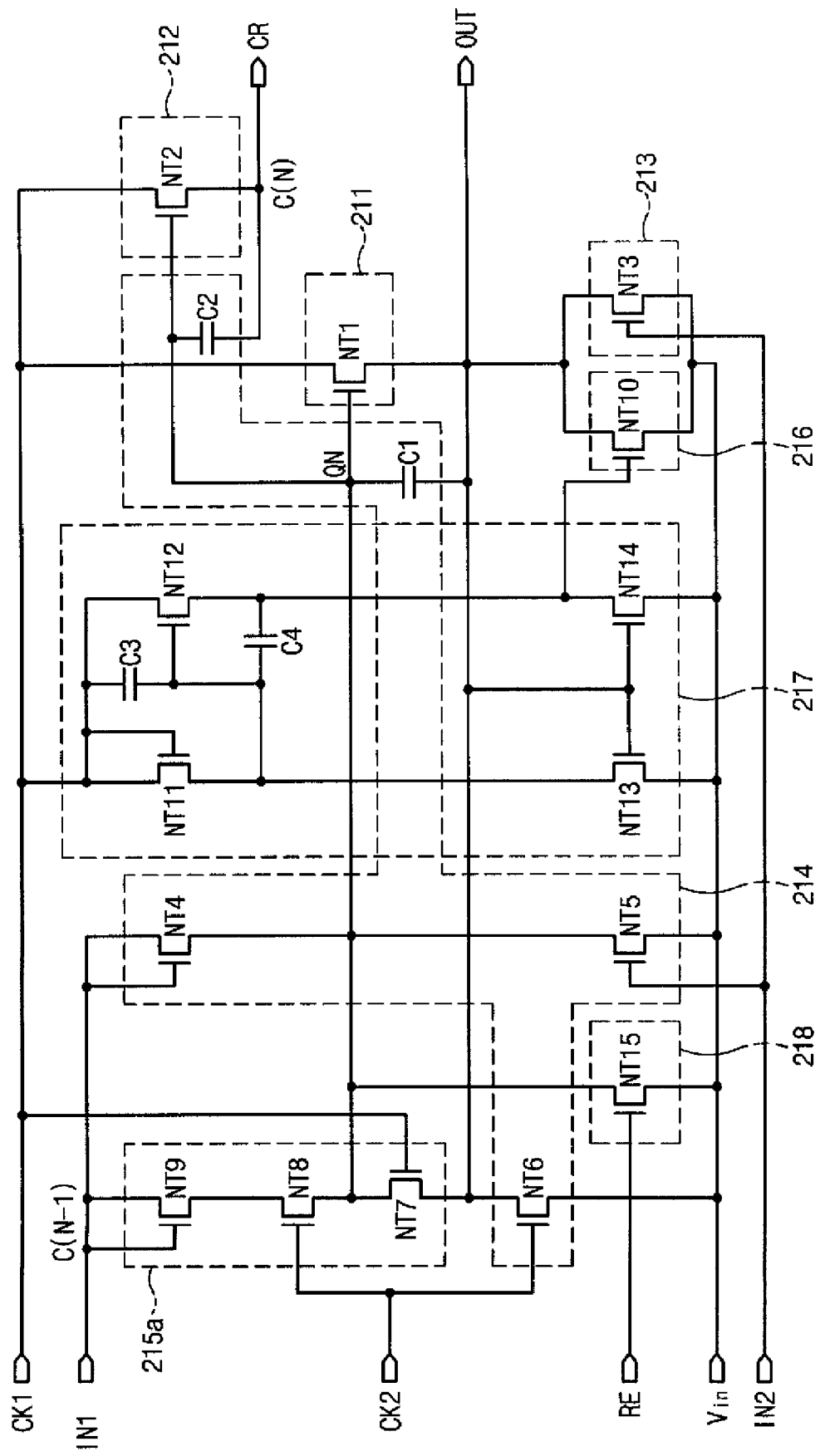
FIG. 3 is a circuit diagram showing a stage of FIG. 2.

FIG. 3 is a circuit diagram showing a stage of FIG. 2. Since each stage of the gate driving circuit has the same configuration, only one of the stages will be described in detail with reference to FIG. 3 and detailed descriptions of the other stages will be omitted in order to avoid redundancy.

Referring to FIG. 3, each stage includes a pull-up part 211, a carry part 212, a pull-down part 213, a pull-up driving part 214, a ripple preventing part 215a, a holding part 216, an inverter 217, and a reset part 218.

The pull-up part 211 includes a pull-up transistor NT1 having a control electrode connected to an output terminal (hereinafter, referred to as a Q-node) QN of the pull-up driving part 214, an input electrode connected to the first clock terminal CK1, and an output electrode connected to the output terminal OUT. Thus, responsive to a control voltage output from the pull-up driving part 214, the pull-up transistor NT1 pulls up a present gate voltage that is output through the output terminal OUT to a clock (hereinafter, referred to as a first clock CKV, which is applied to the first clock terminal CK1 of the odd stages, as shown in FIG. 2) applied through the first clock terminal CK1. The pull-up transistor NT1 is turned on only during a 1H period where the first clock CKV is maintained at a high state within one frame, thereby maintaining the present gate voltage at a high state during the 1H period. The 1H period is defined as a horizontal scanning period that one gate line of n gate lines GL1-GLn is turned on, a (n−1)H period is defined as a period that n−1 gate lines except the one gate line are sequentially turned on.

The carry part 212 includes a carry transistor NT2 having a control electrode connected to the Q-node QN, an input electrode connected to the first clock terminal CK1, and an output electrode connected to the carry terminal CR. The carry transistor NT2 pulls up a present carry voltage that is output through the carry terminal CR to the first clock CKV in response to the control voltage output from the pull-up driving part 214. The carry transistor NT2 is turned on only during the 1H period within one frame to maintain the present carry voltage at a high state during the 1H period. In the present embodiment, a node to which the carry terminal CR and the output electrode of the carry transistor NT2 are connected is defined as a present carry node C(N).

The pull-down part 213 includes a pull-down transistor NT3 having a control electrode connected to the second input terminal IN2, an input electrode connected to the voltage input terminal Vin, and an output electrode connected to the output terminal OUT. Responsive to the next gate voltage, the pull-down transistor NT3 pulls down the present gate voltage that was pulled up to the first clock CKV to the off-voltage Voff (shown in FIG. 2) that is supplied through the voltage input terminal Vin. That is, the pull-down transistor NT3 pulls down the present gate voltage to a low state after the 1H period.

The pull-up driving part 214 includes a buffer transistor NT4, a first capacitor C1, a second capacitor C2, a first discharge transistor NT5, and a second discharge transistor NT6. The buffer transistor NT4 includes an input electrode and a control electrode commonly connected to the first input terminal IN1 and an output electrode connected to the Q-node QN. The first capacitor C1 is connected between the Q-node QN and the output terminal OUT, and the second capacitor C2 is connected between the control electrode of the carry transistor NT2 and the carry terminal CR. The first discharge transistor NT5 includes an output electrode connected to the output electrode of the buffer transistor NT4, a control electrode connected to the second input terminal IN2, and an input electrode connected to the voltage input terminal Vin. The second discharge transistor NT6 includes an output electrode connected to the output terminal OUT, a control electrode connected to the second clock terminal CK2, and an input electrode connected to the voltage input terminal Vin. In the present embodiment, a node to which the first input terminal IN1 and the input electrode of the buffer transistor NT4 are connected is defined as a previous carry node C(N−1).

When the buffer transistor NT4 is turned on in response to the previous carry voltage, the first capacitor C1 and the second capacitor C2 are charged. When an electrical charge, which is higher than a threshold voltage of the pull-up transistor NT1, is charged to the first capacitor C1, the electric potential of the Q-node QN increases to a point higher than the threshold voltage, turning on the pull-up transistor NT1 and the carry transistor NT2. Thus, the first clock CKV is output from the output terminal OUT and the carry terminal CR, thereby raising the present gate voltage and the carry voltage to a high state. That is, the present gate voltage and the present carry voltage are maintained at a high state during the high period 1H of the first clock CKV.

Then, when the first discharge transistor NT5 is turned on in response to the next gate voltage, the electrical charge that is charged to the first capacitor C1 is discharged to the off-voltage Voff through the discharge transistor NT5. Thus, the electric potential of the Q-node QN is lowered to the off-voltage Voff by the next gate voltage, turning off the pull-up transistor NT1 and the carry transistor NT2. That is, since the first discharge transistor NT5 is turned on after the 1H period in order to turn off the pull-up transistor NT1 and the carry transistor NT2, the first discharge transistor NT5 may prevent the present gate voltage and the present carry voltage from being output to the output terminal OUT and the carry terminal CR at a high state.

The second discharge transistor NT6 is turned on in response to the second clock CKVB (shown in FIG. 2) applied through the second clock terminal CK2. When the second discharge transistor NT6 is turned on, the output terminal OUT is connected to the voltage input terminal Vin through the second discharge transistor NT6. Thus, the present gate voltage of the output terminal OUT is discharged to the off-voltage Voff through the second discharge transistor NT6.

The ripple preventing part 215a prevents the present gate voltage and the present carry voltage from being rippled by the first clock CKV or the second clock CKVB during the period other than the 1H period within one frame (hereinafter, referred to as the (n−1)H period). The ripple preventing part 215a includes a first ripple preventing transistor NT7, a second ripple preventing transistor NT8, and a back-flow preventing transistor NT9.

The first ripple preventing transistor NT7 includes a control electrode connected to the first clock terminal CK1, an input electrode connected to the Q-node QN, and an output electrode connected to the output terminal OUT. The second ripple preventing transistor NT8 includes a control electrode connected to the second clock terminal CK2, an input electrode connected to the first input terminal IN1, and an output electrode connected to the Q-node QN. The back-flow preventing transistor NT9 includes a control electrode and an input electrode commonly connected to the first input terminal IN1 and an output electrode connected to the input electrode of the second ripple preventing transistor NT8.

The first ripple preventing transistor NT7 is turned on in response to the first clock CKV, connecting the output terminal OUT to the Q-node QN. Then, the electric potential of the Q-node QN is lowered to the present gate voltage, which has the same voltage level as the off-voltage Voff. Thus, during the high period of the first clock CKV within the (n−1)H period, the electric potential of the Q-node QN is maintained at the off-voltage Voff. As a result, the first ripple preventing transistor NT7 prevents the pull-up transistor NT1 and the carry transistor NT2 from turning on during the high period of the first clock CKV within the (n−1)H period.

The second ripple preventing transistor NT8 is turned on in response to the second clock CKVB provided through the second clock terminal CK2, connecting the previous carry node C(N−1) to the Q-node QN. Thus, the second ripple preventing transistor NT8 discharges the electric potential of the previous carry node C(N−1) to the off-voltage Voff in response to the electric potential of the Q-node QN held in the off-voltage Voff. As a result, the second ripple preventing transistor NT8 may prevent the ripple of the previous carry node C(N−1).

The back-flow preventing transistor NT9 connects the previous carry node C(N−1) and the second ripple preventing transistor NT8 in response to the previous carry voltage and prevents the electric charge of the Q-node QN from -flowing back to the previous carry node C(N−1). Specifically, when the next gate voltage applied to the second input terminal IN2 is delayed for a predetermined time while the second ripple preventing transistor NT8 is turned on during the high period of the second clock CKVB within the (n−1)H period, the discharge of the Q-node QN to the off-voltage Voff is also delayed for the predetermined time. The back-flow preventing transistor NT9 prevents the electric charge of the Q-node QN from flowing back to the previous carry node C(N−1) when the second ripple preventing transistor NT8 is turned on and the electric charge of the Q-node QN is insufficiently discharged. As a result, the back-flow preventing transistor NT9 may prevent the ripple of the previous carry node C(N−1).

The holding part 216 includes a holding transistor NT10 having a control electrode connected to the output terminal of the inverter 217, an input electrode connected to the voltage input terminal Vin, and an output electrode connected to the output terminal OUT.

The inverter 217 turns the holding transistor NT10 on and off and includes a first inverter transistor NT11, a second inverter transistor NT12, a third inverter transistor NT13, a fourth inverter transistor NT14, a third capacitor C3, and a fourth capacitor C4.

The first inverter transistor NT11 includes an input electrode and a control electrode commonly connected to the first clock terminal CK1 and an output electrode connected to the output electrode of the second inverter transistor NT12 through the fourth capacitor C4. The second inverter transistor NT12 includes an input electrode connected to the first clock terminal CK1, a control electrode connected to the input electrode thereof through the third capacitor C3, and an output electrode connected to the control electrode of the holding transistor NT10. The third inverter transistor NT13 includes an input electrode connected to the output electrode of the first inverter transistor NT11, a control electrode connected to the output terminal OUT, and an output electrode connected to the voltage input terminal Vin. The fourth inverter transistor NT14 includes an input electrode connected to the control electrode of the holding transistor NT10, a control electrode connected to the output terminal OUT, and an output electrode connected to the voltage input terminal Vin.

The third inverter transistor NT13 and the fourth inverter transistor NT14 are turned on in response to the present gate voltage being output to the output terminal OUT at a high state and the first clock CKV being output from the first inverter transistor NT11. The second inverter transistor NT12 is discharged to the off-voltage Voff. Thus, the holding transistor NT10 is turned off during the 1H period when the present gate voltage is maintained at a high state. When the present gate voltage is decreased to a low state, the third inverter transistor NT13 and the fourth inverter transistor NT14 are turned off. Thus, responsive to the first clock CKV output from the first and the second inverter transistors NT11 and NT12, the holding transistor NT10 is turned on. As a result, the present gate voltage may be held in the off-voltage Voff during the high period of the first clock CKV within the (n−1)H period by the holding transistor NT10.

The reset part 218 includes a reset transistor NT15 having a control electrode connected to the reset terminal RE, an input electrode connected to the Q-node QN, and an output electrode connected to the voltage input terminal Vin. The reset transistor NT15 discharges a noise input through the first input terminal IN1 to the off-voltage Voff in response to the last carry voltage input through the reset terminal RE and output from the last stage SRCn+1 (shown in FIG. 2). Thus, the pull-up transistor NT1 and the carry transistor NT2 are turned off in response to the last carry voltage from the last stage SRCn+1. As a result, the last carry voltage is provided to the reset terminals RE of the stages to turn off the pull-up transistor NT1 and the carry transistor NT2 of each stage, thereby resetting each stage.

Figure 4A:
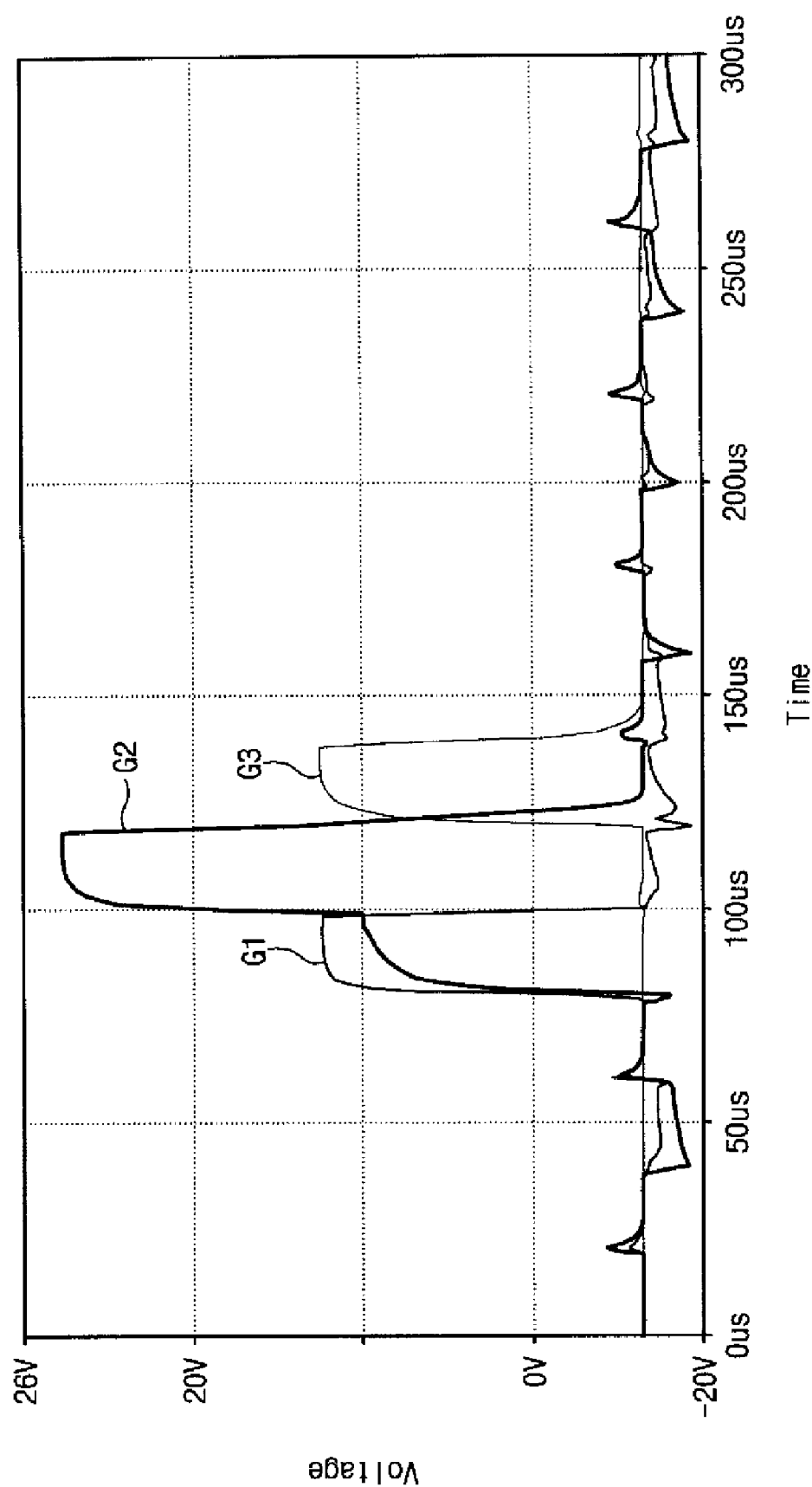
FIG. 4A is a graph showing electric potentials of a previous carry node, a Q-node, and a next gate voltage in a conventional structure.
Figure 4B:
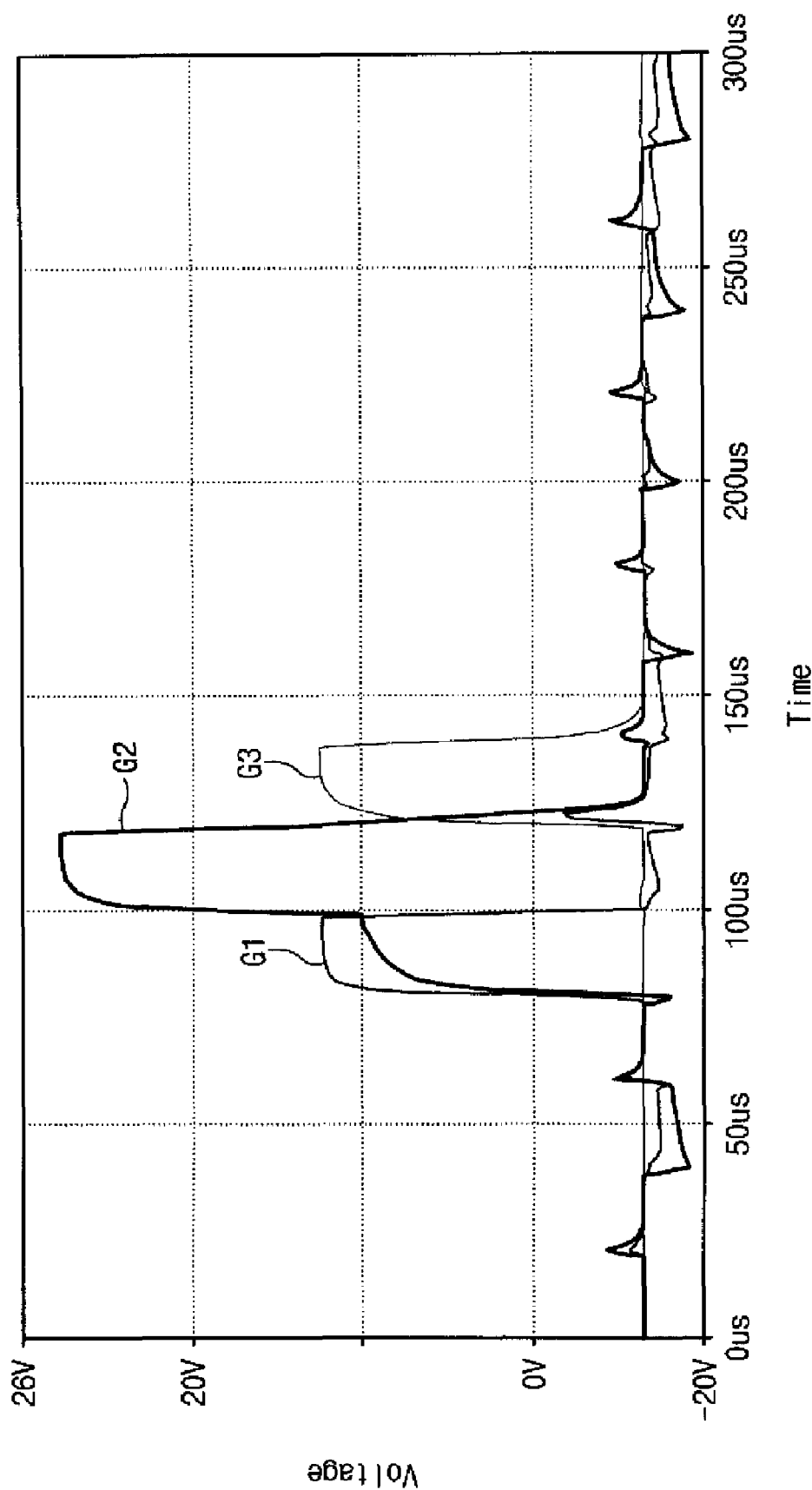
FIG. 4B is a graph showing electric potentials of a previous carry node, a Q-node, and a next gate voltage according to an exemplary embodiment of the present invention.

FIG. 4A is a graph showing electric potentials of a previous carry node, a Q-node, and a next gate voltage in a conventional structure. FIG. 4B is a graph showing electric potentials of a previous carry node, a Q-node, and a next gate voltage according to the present invention. In FIG. 4A and FIG. 4B, x and y axes represent time (μs) and voltage (V), respectively.

In FIG. 4A and FIG. 4B, G1 represents the electric potential of the previous carry node, G2 represents the electric potential of the Q-node, and G3 represents the next gate voltage.

Referring to FIG. 4A, a predetermined delay time d1 is necessary to raise the next gate voltage to a high state just after the 1H period. The electric potential of the Q-node QN (shown in FIG. 3) is not completely discharged to the off-voltage Voff (shown in FIG. 2) after the 1H period due to the delay time. When the second ripple preventing transistor NT8 (shown in FIG. 3) is turned on in response to the second clock CKVB (shown in FIG. 2), the electric charge of the Q-node QN is transferred to the previous carry node C(N−1) (shown in FIG. 3). Thus, in a conventional structure, the previous carry voltage may be rippled just after a 1H period.

In the exemplary embodiment shown in FIG. 4B, the electric charge of the Q-node QN does not flow back to the previous carry node C(N−1) because of the back-flow preventing transistor NT9 (shown in FIG. 3), even though the electric potential of the Q-node QN is not completely discharged to the off-voltage Voff after the 1H period. Thus, it may be possible to prevent rippling of the previous carry voltage. As a result, in the present invention, the electric potential of the previous carry node C(N−1) may be stabilized by the back-flow preventing transistor NT9.

Figure 5:
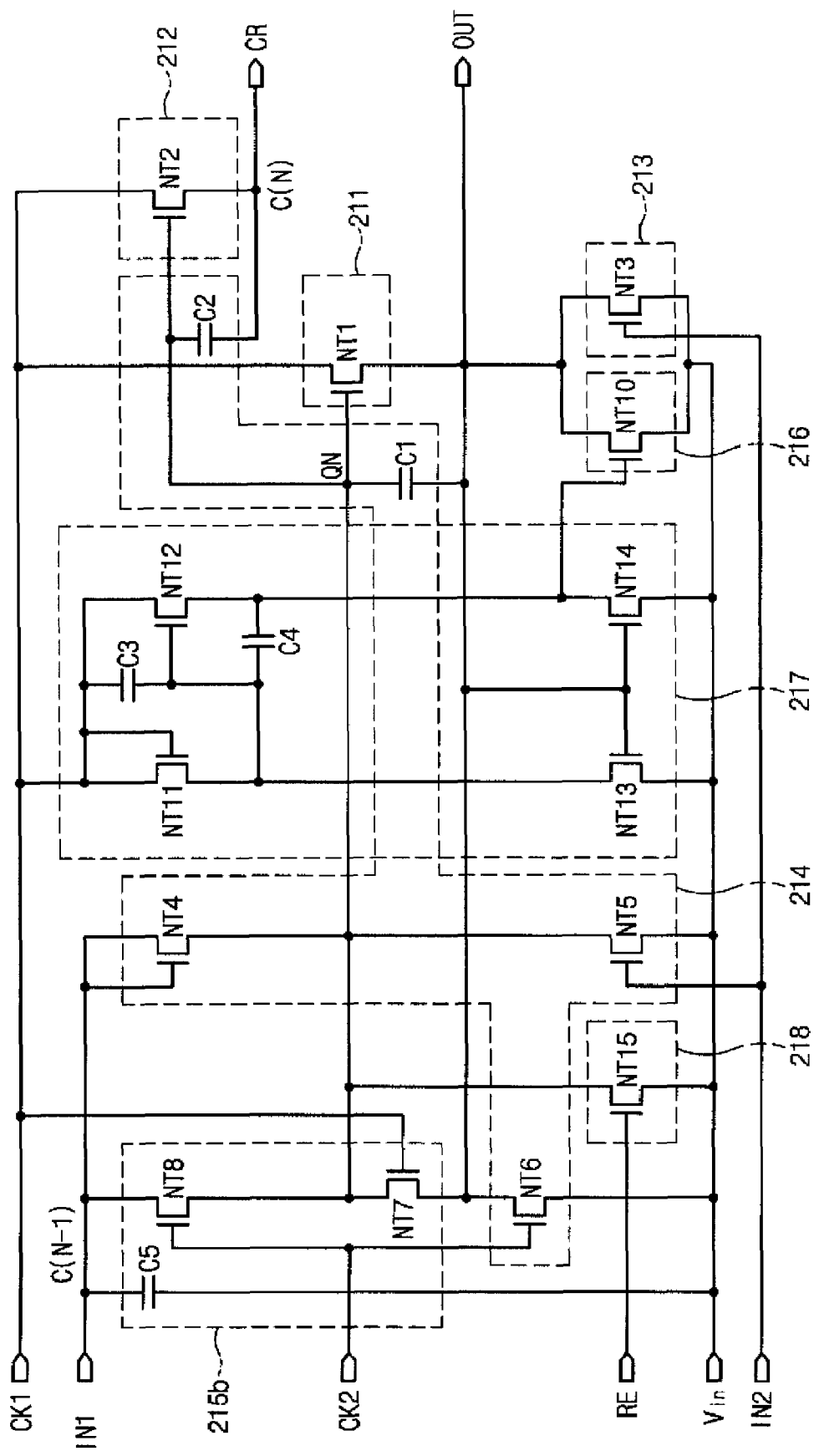
FIG. 5 is a circuit diagram showing another exemplary embodiment of a gate driving circuit according to the present invention.

FIG. 5 is a circuit diagram showing another exemplary embodiment of a gate driving circuit according to the present invention. In FIG. 5, the same reference numerals denote the same elements as in FIG. 3, and thus, the detailed description of the same elements will be omitted.

Referring to FIG. 5, a ripple preventing part 215b of each stage, according to another exemplary embodiment of the present invention, includes a first ripple preventing transistor NT7, a second ripple preventing transistor NT8, and a holding capacitor C5. The holding capacitor C5 is connected between a previous carry node C(N−1) and a voltage input terminal Vin.

The first ripple preventing transistor NT7 discharges the electric potential of the Q-node QN to the present gate voltage, which is maintained at an off-voltage Voff (shown in FIG. 2) during a high period of a first clock CKV (shown in FIG. 2), thereby holding the electric potential of the Q-node QN in the off-voltage Voff. The second ripple preventing transistor NT8 connects the previous carry node C(N−1) and the Q-node QN during a high period of a second clock CKVB (shown in FIG. 2) to apply the previous carry voltage to the Q-node QN.

The previous carry voltage is in a floating state during a (n−1)H period. When the previous carry node C(N−1) is connected to the Q-node QN by the second ripple preventing transistor NT8, the previous carry voltage in the floating state is applied to the Q-node QN, causing a ripple of the Q-node QN.

The holding capacitor C5 may reduce the ripple of the previous carry voltage applied to the previous carry node C(N−1). That is, the electric potential of the previous carry node C(N−1) may be stabilized by the holding capacitor C5.

Figure 6:
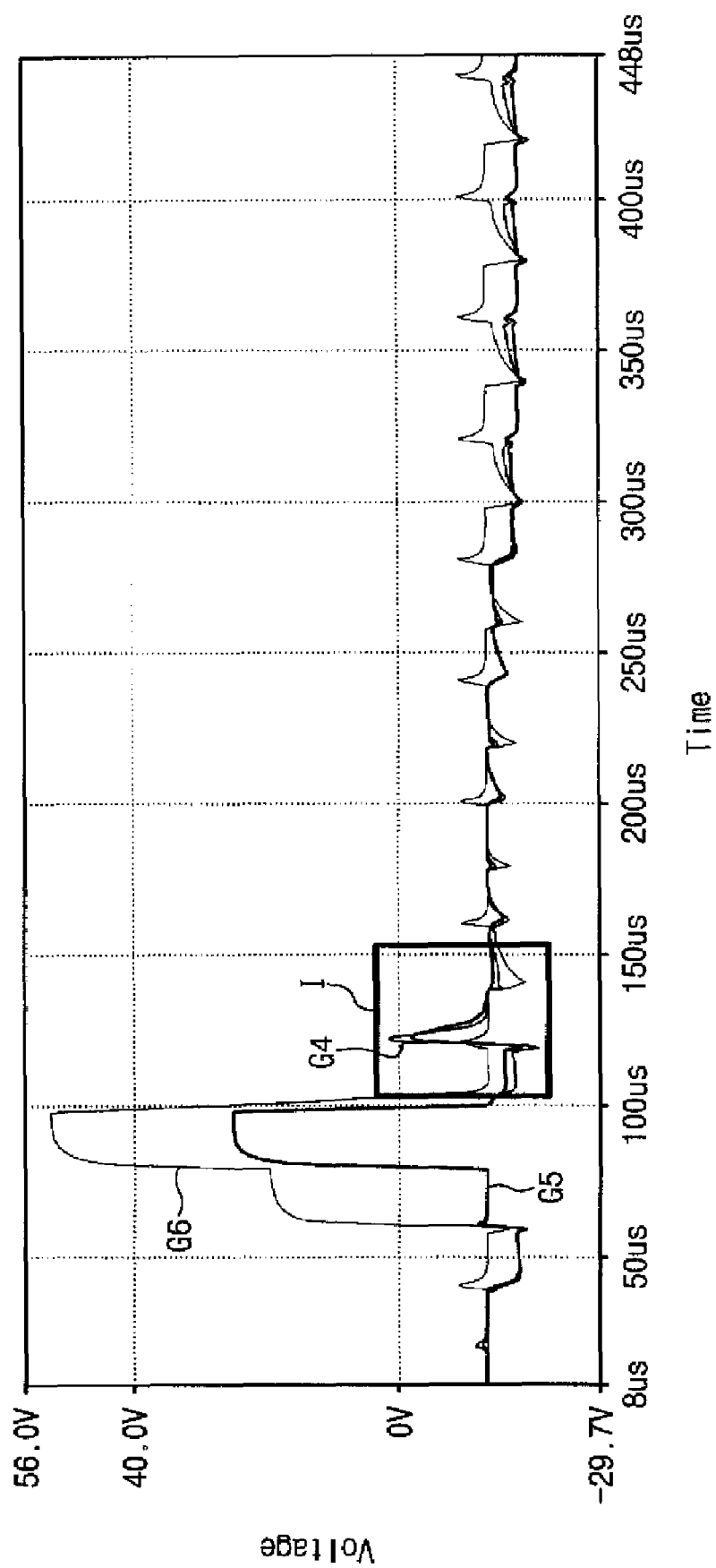
FIG. 6 is a waveform diagram showing electric potentials of a previous carry node and a Q-node of FIG. 5.
Figure 7:
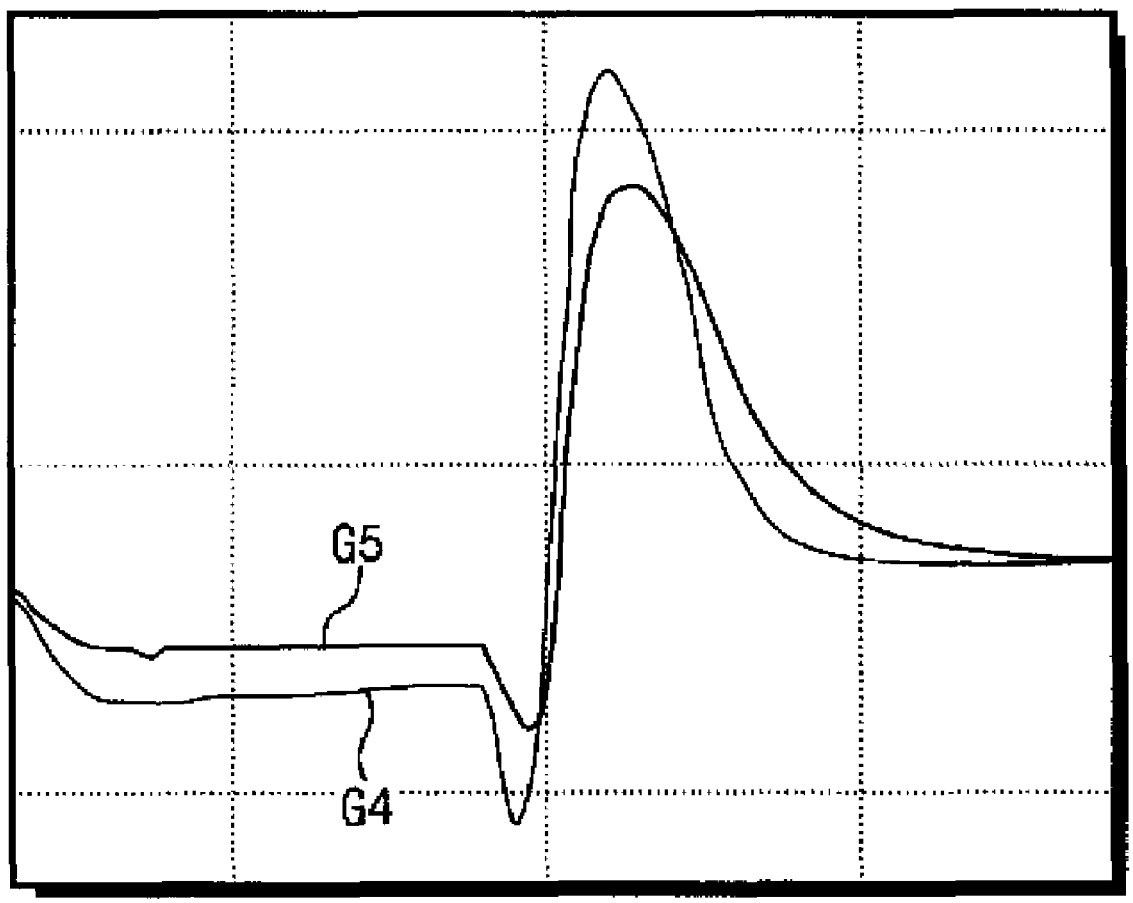
FIG. 7 is an enlarged view showing portion "I" of FIG. 6.

FIG. 6 is a waveform diagram showing electric potentials of a previous carry node and a Q-node of FIG. 5, and FIG. 7 is an enlarged view showing a portion "I" of FIG. 6. In FIG. 6, the x-axis represents time (μs) and the y-axis represents voltage (V).

In FIG. 6, G4 shows the electric potential of a previous carry node in a conventional structure, G5 shows the electric potential of the previous carry node according to the present invention, and G6 shows the electric potential of the Q-node according to the present invention.

Referring to FIG. 6 and FIG. 7, when the ripple preventing part 215b (shown in FIG. 5) includes the holding capacitor C5 (shown in FIG. 5), the ripple of the previous carry node C(N−1) (shown in FIG. 5) may be reduced.

Although not shown in figures, the ripple in the previous carry node may be further reduced as the circumferential temperature increases.

Figure 8:
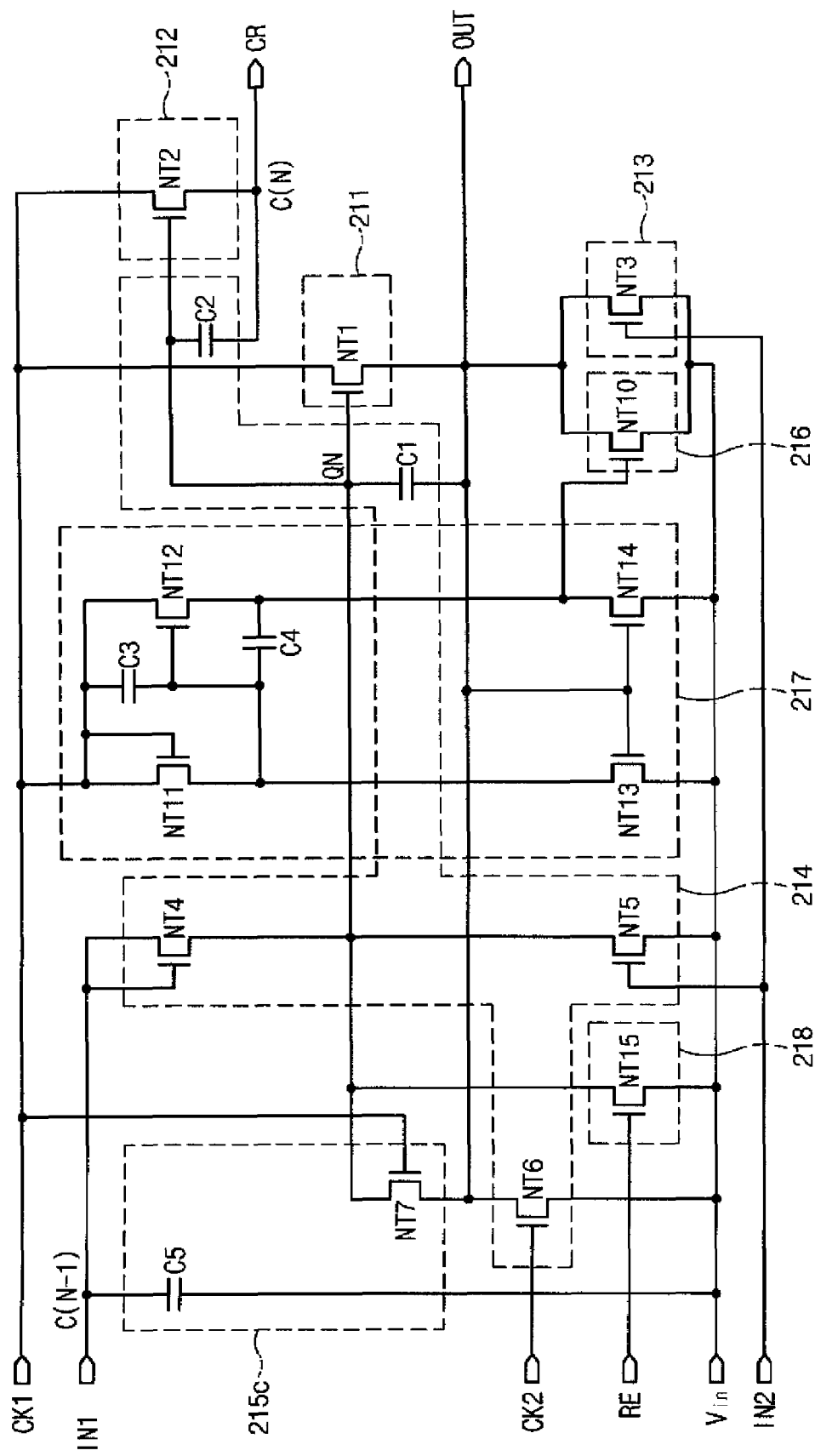
FIG. 8 is a circuit diagram showing another exemplary embodiment of a gate driving circuit according to the present invention.

FIG. 8 is a circuit diagram showing another exemplary embodiment of each stage of a gate driving circuit, according to the present invention. In FIG. 8, the same reference numerals denote the same elements as in FIG. 5, and thus, the detailed description of the same elements will be omitted.

Referring to FIG. 8, a ripple preventing part 215c of each stage according to another exemplary embodiment of the present invention includes a first ripple preventing transistor NT7 and a holding capacitor C5.

The first ripple preventing transistor NT7 discharges an electric potential of a Q-node QN to a present gate voltage during a high period of a first clock CKV (shown in FIG. 2) within a (n−1)H period. Thus, the electric potential of the Q-node QN is held in an off-voltage Voff.

When a second ripple preventing transistor NT8 shown in FIG. 5 is removed from the ripple preventing part 215c, the previous carry node C(N−1) is not connected to the Q-node QN. Thus, the ripples occurring in the Q-node QN and the previous carry node C(N−1) may be reduced, which may stabilize the electric potentials of the Q-node QN and the previous carry node C(N−1).

Meanwhile, the electric potential of the Q-node QN is increased by the holding capacitor C5 during a 1H period. Thus, the output characteristics of the pull-up transistor NT1 and the carry transistor NT2 connected to the Q-node QN may be improved according to the increase of the electric potential of the Q-node QN.

Figure 9:
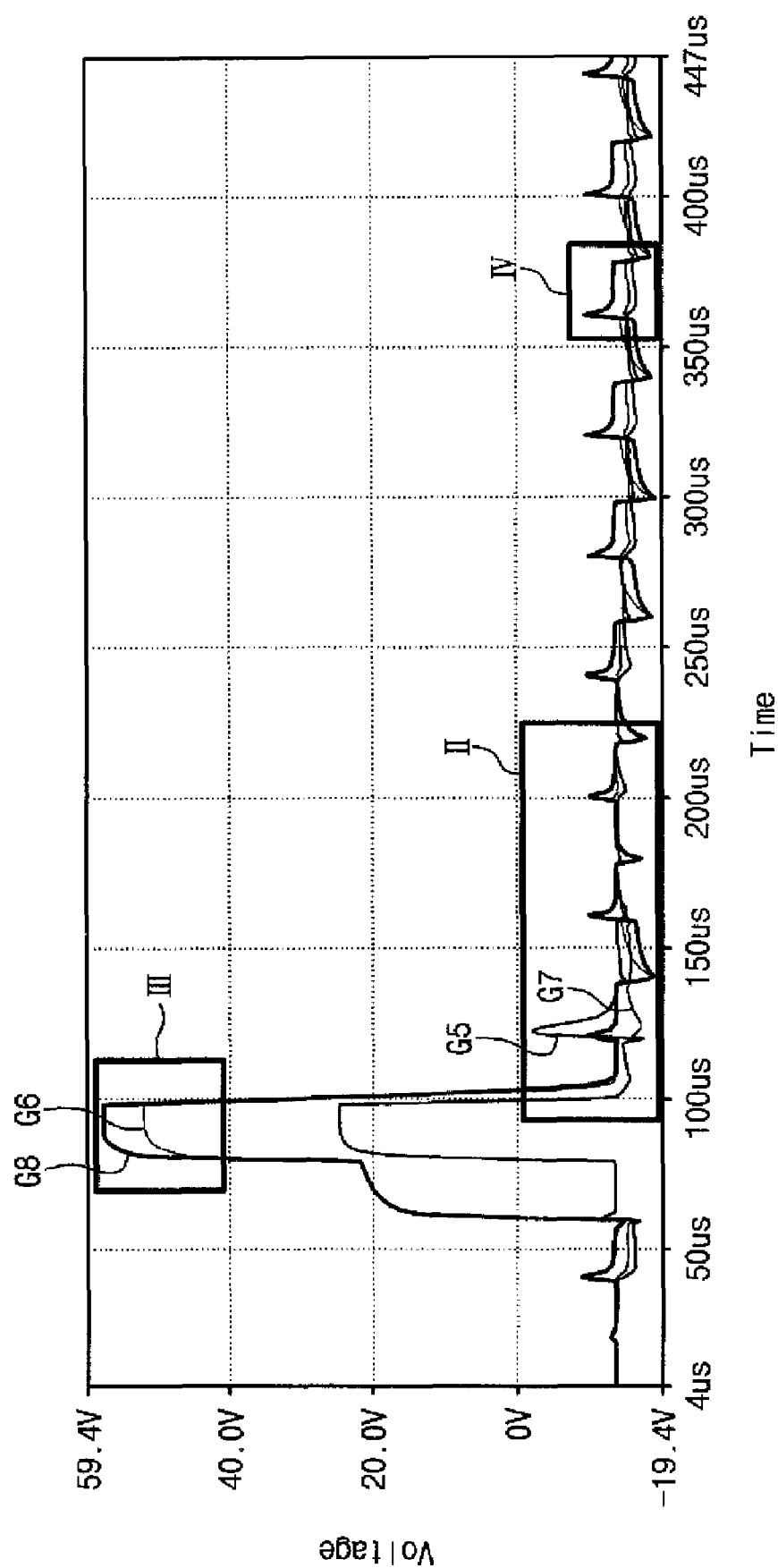
FIG. 9 is a waveform diagram showing electric potentials of a previous carry node and a Q-node of FIG. 8.
Figure 10A:
FIG. 10A is an enlarged view showing portion "II" of FIG. 9.
Figure 10B:
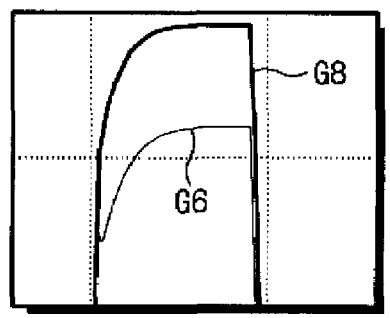
FIG. 10B is an enlarged view showing portion "III" of FIG. 9.
Figure 10C:
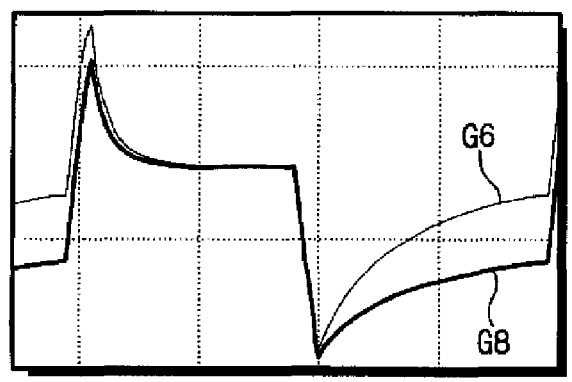
FIG. 10C is an enlarged view showing portion "I" of FIG. 9.

FIG. 9 is a waveform diagram showing electric potentials of the previous carry node and the Q-node of FIG. 8, FIG. 10A is an enlarged view showing portion "II" of FIG. 9, FIG. 10B is an enlarged view showing portion "III" of FIG. 9, and FIG. 10C is an enlarged view showing portion "IV" of FIG. 9. In FIG. 9, the x-axis represents time (μs) and the y-axis represents voltage (V).

In FIG. 9, G5 shows the electric potential of the previous carry node shown in FIG. 5 and G7 shows the electric potential of the previous carry node shown in FIG. 8. G6 shows the electric potential of the Q-node shown in FIG. 5 and G8 shows the electric potential of the Q-node shown in FIG. 8.

Referring to FIG. 9 and FIG. 10A, when the ripple preventing part 215b includes the second ripple preventing transistor NT8, as shown by G5, a ripple occurs in the previous carry node C(N−1) (shown in FIG. 5). However, when the second ripple preventing transistor NT8 is removed from the ripple preventing part 215c, as shown by G7, the ripple does not occur in the previous carry node C(N−1). That is, when the ripple preventing part 215c includes a holding capacitor C5, a ripple in the previous carry node C(N−1) may be prevented by removing the second ripple preventing transistor NT8.

Referring to FIG. 10B, when the second ripple preventing transistor NT8 is removed from the ripple preventing part 215c and the holding capacitor C5 is included in the ripple preventing part 215c, the electric potential of the Q-node QN is increased during the 1H period by the holding capacitor C5. Thus, the output characteristics of the pull-up transistor NT1 and the carry transistor NT2 connected to the Q-node QN may be improved as seen by the increase in the electric potential of the Q-node QN.

Referring to FIG. 10C, the ripple occurring in the Q-node QN during the (n−1)H period may be reduced when the ripple preventing part 215b does not include a second ripple preventing transistor NT8.

As a result, when the second ripple preventing transistor NT8 is removed from the ripple preventing part 215c, the ripple in the previous carry node C(N−1) and in the Q-node QN may be reduced, which may improve the output characteristics of each stage.

Figure 11:
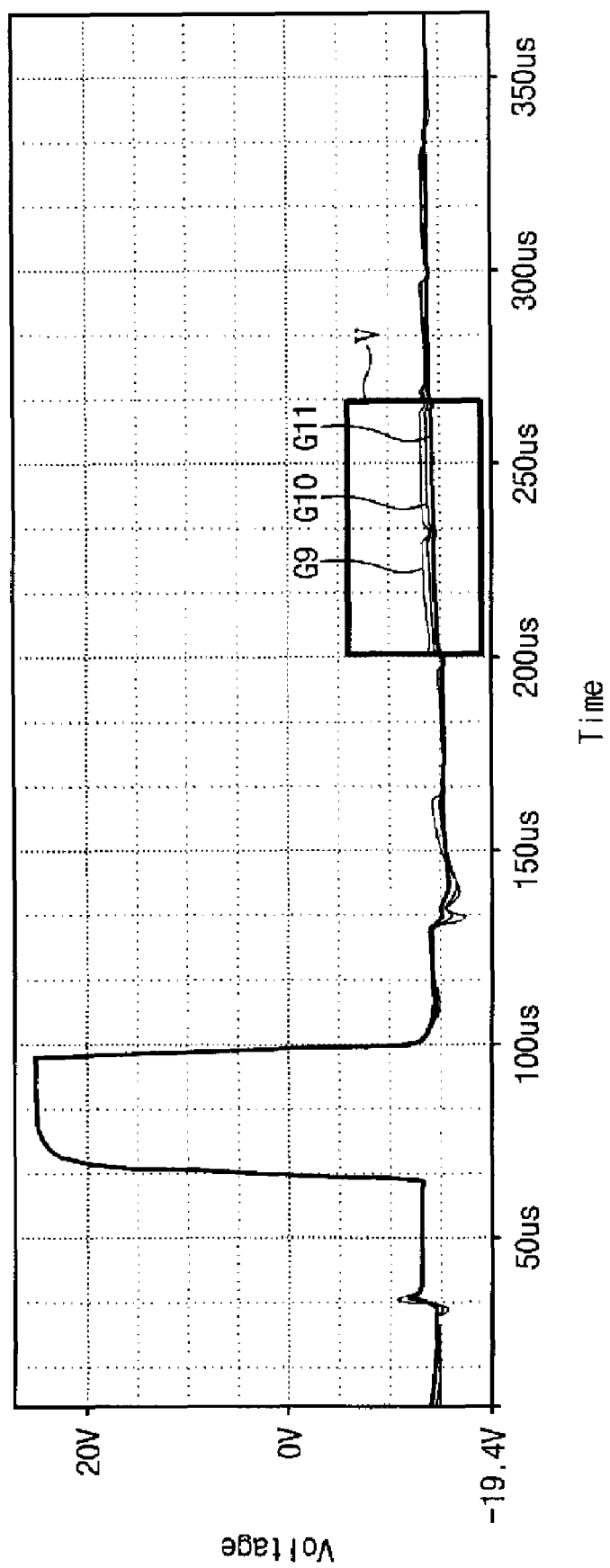
FIG. 11 is a waveform diagram showing a ripple variation in a previous carry node due to a capacitance of a holding capacitor of FIG. 8.
Figure 12:
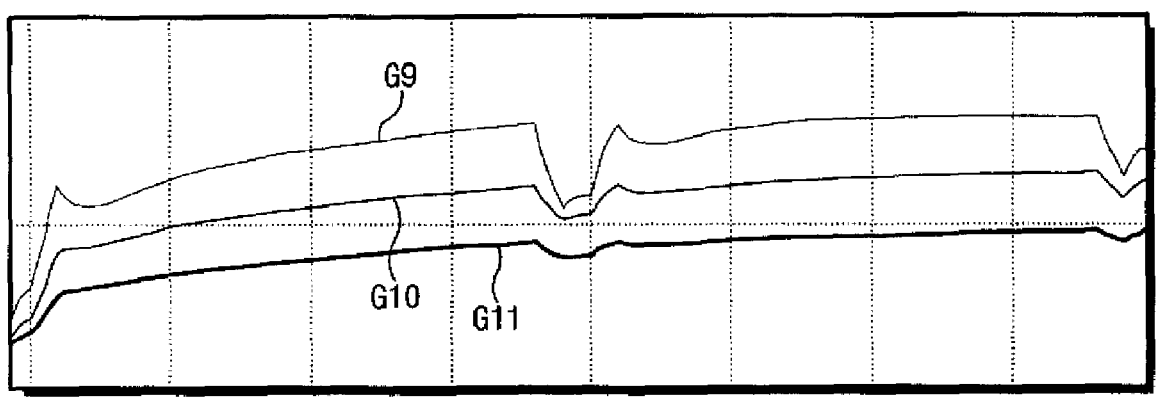
FIG. 12 is an enlarged view showing portion "V" of FIG. 11.

FIG. 11 is a waveform diagram showing a ripple variation in the previous carry node according to the capacitance of the holding capacitor C5 of FIG. 8, and FIG. 12 is an enlarged view showing portion "V" of FIG. 11. In FIG. 11, the x-axis represents time (μs) and the y-axis represents voltage (V).

In FIG. 11, G9 shows the electric potential of the previous carry node C(N−1) when the holding capacitor C5 has a capacitance of about 0.5 pF, G10 shows the electric potential of the previous carry node C(N−1) when the holding capacitor C5 has a capacitance of about 2.0 pF, and G11 shows the electric potential of the previous carry node C(N−1) when the holding capacitor C5 has a capacitance of about 5.0 pF.

As shown in FIG. 11 and FIG. 12, as the capacitance of the holding capacitor C5 (shown in FIG. 8) increases, the ripple occurring in the previous carry node C(N−1) decreases. Thus, the ripple occurring in the previous carry node C(N−1) may be substantially removed when the size of the holding capacitor C5 is increased in consideration of the marginal area of the gate driving circuit.

Each stage of the gate driving circuit includes a float preventing transistor which resets the electric potential of the present carry node to the off-voltage during the (n−1)H period.

Thus, the electric potential of the Q-node of the next stage may be maintained at the off-voltage during the (n−1)H period to prevent rippling of the next gate signal and the next carry signal output from the next stage, which may improve the drive characteristics of the gate driving circuit. Also, the gate driving circuit may prevent drive malfunction caused by noise during a high-temperature test, resulting in a more reliable gate driving circuit.

It will be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

What is claimed is:

1. A gate driving circuit in which a plurality of stages are connected to each other, each stage comprising:
    a pull-up part to pull up a present gate signal to a first clock during a 1H period;
    a pull-down part to discharge the present gate signal to an off-voltage;
    a pull-up driving part to turn on the pull-up part and turn off the pull-up part, the pull-up driving part being connected to a Q-node of the pull-up part; and
    a ripple preventing part to prevent a ripple of the present gate signal and an input terminal of the pull-up driving part, wherein the ripple preventing part comprises:
    a first ripple preventing device to connect the Q-node and a present output terminal during a high period of the first clock within a (n−1)H period;
    a second ripple preventing device to connect the input terminal of the pull-up driving part and the Q-node during a high period of a second clock within the (n−1)H period; and
    a back-flow preventing device connected between the input terminal of the pull-up driving part and the second ripple preventing device to prevent an electric charge of the Q-node from flowing back to the input terminal of the pull-up driving part.

2. The gate driving circuit of claim 1, wherein the each stage further comprises a carry part to pull up a present carry signal to the first clock during the 1H period,
    the pull-down part receives a next gate signal from a next stage and the pull-up driving part receives a previous carry signal from a previous stage through the input terminal of the pull-up driving part.

3. The gate driving circuit of claim 2, wherein:
the first ripple preventing device comprises a first ripple preventing transistor comprising a control electrode receiving the first clock, an input electrode connected to the Q-node, and an output electrode connected to the present output terminal;
the second ripple preventing device comprises a second ripple preventing transistor comprising a control electrode receiving the second clock, an input electrode connected to the back-flow preventing device, and an output electrode connected to the Q-node; and
the back-flow preventing device comprises a back-flow preventing transistor comprising a control electrode and an input electrode commonly connected to the input terminal of the pull-up driving part and an output electrode connected to the input electrode of the second ripple preventing transistor.

4. The gate driving circuit of claim 2, wherein:
the pull-up part comprises a pull-up transistor comprising a control electrode connected to the Q-node, an input electrode to receive the first clock, and an output electrode to output the present gate signal; and
the carry part comprises a carry transistor comprising a control electrode connected to the Q-node, an input electrode to receive the first clock, and an output electrode to output the present carry signal.

5. The gate driving circuit of claim 4, wherein the pull-up driving part comprises:
a buffer transistor comprising a control electrode and an input electrode to commonly receive the previous carry signal, and an output electrode connected to the Q-node;
a first capacitor connected between the control electrode and the output electrode of the pull-up transistor;
a second capacitor connected between the control electrode and the output electrode of the carry transistor;
a first discharge transistor comprising a control electrode to receive the next gate signal, an input electrode to receive the off-voltage, and an output electrode connected to the output electrode of the buffer transistor; and
a second discharge transistor comprising a control electrode to receive the second clock, an input electrode to receive the off-voltage, and an output electrode connected to the output electrode of the pull-up transistor.

6. The gate driving circuit of claim 1, wherein each stage further comprises:
a holding part to maintain the present gate signal at the off-voltage; and
an inverter to turn the holding part on or off in response to the first clock.

7. The gate driving circuit of claim 6, wherein the holding part comprises:
a holding transistor comprising a control electrode connected to an output terminal of the inverter,
an input electrode to receive the off-voltage, and
an output electrode connected to an output terminal of the pull-up part.

8. The gate driving circuit of claim 1, wherein the first clock has a phase opposite that of the second clock.

9. A gate driving circuit in which a plurality of stages are connected to each other, each stage comprising:
a pull-up part to pull up a present gate signal to a first clock during a 1H period;
a pull-down part to discharge the present gate signal to an off-voltage;
a pull-up driving part to turn on the pull-up part and turn off the pull-up part, the pull-up driving part being connected to a Q-node of the pull-up part; and
a ripple preventing part to prevent a ripple of the present gate signal and an input terminal of the pull-up driving part, wherein the ripple preventing part comprises:
a first ripple preventing device to connect the Q-node and a present output terminal during a high period of the first clock within a (n−1)H period; and
a holding capacitor connected between the input terminal of the pull-up part and an off-voltage terminal to reduce the ripple of the input terminal of the pull-up driving part.

10. The gate driving circuit of claim 9, wherein the each stage further comprises a carry part to pull up a present carry signal to the first clock during the 1H period,
the pull-down part receives a next gate signal from a next stage, and the pull-up driving part receives a previous carry signal from a previous stage through the input terminal of the pull-up driving part.

11. The gate driving circuit of claim 10, wherein the first ripple preventing device comprises a first ripple preventing transistor comprising:
a control electrode to receive the first clock,
an input electrode connected to the Q-node, and
an output electrode connected to the present output terminal.

12. The gate driving circuit of claim 10, wherein the ripple preventing part further comprises a second ripple preventing device to connect a previous carry node and the Q-node during a high period of a second clock within the (n−1)H period.

13. The gate driving circuit of claim 12, wherein the second ripple preventing device comprises a second ripple preventing transistor comprising:
a control electrode to receive the second clock,
an input electrode connected to the input terminal of the pull-up driving part, and
an output electrode connected to the Q-node.

14. A display apparatus, comprising:
a display part to display an image in response to a gate signal and a data signal;
a data driving circuit to apply the data signal to the display part; and
a gate driving circuit sequentially outputting the gate signal to the display part, the gate driving circuit comprising a plurality of stages connected to each other,
each stage comprising:
a pull-up part to pull up a present gate signal to a first clock during a 1H period;
a pull-down part to discharge the present gate signal to an off-voltage;
a pull-up driving part to turn on the pull-up part and turn off the pull-up part, the pull-up driving part being connected to a Q-node of the pull-up part; and
a ripple preventing part to prevent a ripple of the present gate signal and a input terminal of the pull-up driving part,
wherein the ripple preventing part comprises:
a first ripple preventing device to connect the Q-node and a present output terminal during a high period of the first clock within a (n−1)H period;
a second ripple preventing device to connect the input terminal of the pull-up driving part and the Q-node during a high period of a second clock within the (n−1)H period; and a back-flow preventing device connected between the input terminal of the pull-up driving part and the second ripple preventing device to prevent an electric charge of the Q-node from flowing back to the input terminal of the pull-up driving part.

15. The display apparatus of claim 14, wherein the each stage further comprises a carry part to pull up a present carry signal to the first clock during the 1H period, the pull-down part receives a next gate signal from a next stage and the pull-up driving part receives a previous carry signal from a previous stage through the input terminal of the pull-up driving part.

16. The display apparatus of claim 15, wherein:

the first ripple preventing device comprises a first ripple preventing transistor comprising a control electrode to receive the first clock, an input electrode connected to the Q-node, and an output electrode connected to the present output terminal;

the second ripple preventing device comprises a second ripple preventing transistor comprising a control electrode to receive the second clock, an input electrode connected to the back-flow preventing device, and an output electrode connected to the Q-node; and the back-flow preventing device comprises a back-flow preventing transistor comprising a control electrode and an input electrode commonly connected to the input terminal of the pull-up driving part and an output electrode connected to the input electrode of the second ripple preventing transistor.

17. The display apparatus of claim 14, wherein the display part comprises:

an array substrate comprising a plurality of gate lines to receive the gate signal, a plurality of data lines to receive the data signal, a thin film transistor to output the data signal in response to the gate signal, and a pixel electrode to receive the data signal;

an opposite substrate comprising a common electrode facing the pixel electrode, the opposite substrate being coupled with the array substrate; and a liquid crystal layer disposed between the array substrate and the opposite substrate, wherein the pixel electrode and the common electrode control a light transmittance of the liquid crystal layer.

18. The display apparatus of claim 17, wherein the gate driving circuit and the thin film transistor are formed on the array substrate through the same thin film process.

19. A display apparatus, comprising:

a display part to display an image in response to a gate signal and a data signal;

a data driving circuit to apply the data signal to the display part; and a gate driving circuit to output the gate signal to the display part, in which a plurality of stages are connected to each other, each stage of the gate driving circuit comprising:

a pull-up part to pull up a present gate signal to a first clock during a 1H period;

a pull-down part to discharge the present gate signal to an off-voltage;

a pull-up driving part to turn on the pull-up part and turn off the pull-up part, the pull-up driving part being connected to a Q-node of the pull-up part; and a ripple preventing part to prevent a ripple of the present gate signal and an input terminal of the pull-up driving part, wherein the ripple preventing part comprises:

a first ripple preventing device to connect the Q-node and a present output terminal during a high period of the first clock within a (n−1)H period; and a holding capacitor connected between the input terminal of the pull-up driving part and an off-voltage terminal to reduce the ripple of the input terminal of the pull-up driving part.

20. The display apparatus of claim 19, wherein the each stage further comprises a carry part to pull up a present carry signal to the first clock during the 1H period, the pull-down part receives a next gate signal from a next stage, and the pull-up driving part receives a previous carry signal from a previous stage through the input terminal of the pull-up driving part.

21. The display apparatus of claim 20, wherein the first ripple preventing device comprises a first ripple preventing transistor comprising:

a control electrode to receive the first clock, an input electrode connected to the Q-node, and an output electrode connected to the present output terminal.

22. The display apparatus of claim 20, wherein the ripple preventing part further comprises a second ripple preventing device to connect the previous carry node and the Q-node during a high period of a second clock within the (n−1)H period.

23. The display apparatus of claim 22, wherein the second ripple preventing device comprises a second ripple preventing transistor comprising:

a control electrode to receive the second clock, an input electrode connected to the input terminal of the pull-up driving part, and an output electrode connected to the Q-node.

* * * * *